United States Patent [19]

Jochems

[11] 4,127,864

[45] Nov. 28, 1978

[54] SEMICONDUCTOR DEVICE

[75] Inventor: Pieter J. W. Jochems, Eindhoven, Netherlands

[73] Assignee: U.S. Philips Corporation, New York, N.Y.

[21] Appl. No.: 860,170

[22] Filed: Dec. 13, 1977

Related U.S. Application Data

[63] Continuation of Ser. No. 697,274, Jun. 17, 1976, abandoned.

[30] Foreign Application Priority Data

Jun. 30, 1975 [NL] Netherlands .......................... 7507733

[51] Int. Cl.² ............................................ H01L 27/02
[52] U.S. Cl. ....................................... 357/44; 357/35; 357/48; 148/186; 148/187
[58] Field of Search ............................. 357/48, 44, 35; 148/186, 187

[56] References Cited

U.S. PATENT DOCUMENTS

| | | | |
|---|---|---|---|
| 3,766,446 | 10/1973 | Tarui | 317/235 R |
| 3,885,999 | 5/1975 | Frisaroli et al. | 148/175 |
| 3,913,123 | 10/1975 | Masaki et al. | 357/34 |

Primary Examiner—Martin H. Edlow
Attorney, Agent, or Firm—Frank R. Trifari

[57] ABSTRACT

A semiconductor device having a bipolar transistor of the lateral type, preferably a pnp-transistor which is provided in a homogeneously doped semiconductor layer and which may be provided both in an n-type and in a p-type semiconductor layer and of which the base comprises a highly doped contact region and an associated substantially non-depleted active base region, while the emitter zone is situated substantially entirely within the active base region. Herewith, high frequency complementary transistors can be formed in a single epitaxial layer. The invention furthermore comprises a suitable method of manufacturing said transistor in which use is made of underetching.

13 Claims, 24 Drawing Figures

SEMICONDUCTOR DEVICE

This is a continuation of application Ser. No. 697,274 filed June 17, 1976 now abandoned.

BACKGROUND OF THE INVENTION

The invention relates to a semiconductor device comprising a semiconductor body having at least a bipolar transistor with an emitter zone of a first conductivity type adjoining a surface of the body, a likewise surface-adjoining base zone of the second conductivity type which within the body surrounds the emitter zone entirely, and a surface-adjoining collector zone of the first conductivity type. The base zone comprises an active base region and a base contact region which is associated therewith and which is deeper and more highly doped than the active base region. The base zone, like the emitter zone, is contacted at the surface and the collector zone comprises a surface-adjoining collector contact region of the first conductivity type which is contacted at the surface and has a higher doping concentration than the adjoining semiconductor material. Viewed in a direction parallel to the surface, the active base region is present between the base contact region and the collector contact region, the emitter zone, the active base region, the base contact region and the collector contact region are provided in and have a different doping than a surface-adjoining semiconductor layer that is substantially homogeneously doped and that surrounds the collector contact region and the base regions.

The invention relates in addition to a particularly suitable method of manufacturing such a semi-conductor device.

A semiconductor device of the abovedescribed kind is known, for example, from the U.S. Pat. No. 3,766,446.

In semiconductor technology, and in particular in monolithic integrated circuit technology, it is often endeavoured to produce circuits, and hence semi-conductor circuits, which can be used up to very high frequencies, for example, up to frequencies of one or a few Gigahertz (GHz). In addition it is in many cases desirable for a monolithic integrated circuit to comprise bipolar transistors of both the npn-type and of the pnp-type.

Although reaching such very high frequencies presents technological problems already for vertical npn-transistors, this is the case in particular in monolithic circuits having npn-transistors and pnp-transistors in a single epitaxial layer. The pnp-transistors are nearly always constructed as lateral transistors. Therefore, it is not only substantially impossible to make the pnp-transistors suitable for very high frequencies, due to the lateral structure and due to the low hole mobility, but in general the npn-transistors and pnp-transistors provided in a single epitaxial layer in this manner will show electrically important differences due to their greatly differing geometric structure, which in general is not desirable.

It has been endeavoured to solve this problem by giving both the npn-transistors and pnp-transistors a vertical structure, while using two or more epitaxial layers present one on top of the other, but in addition to the fact that the provision of several epitaxial layers results in a considerable technological complication, further problems occur due to the out-diffusion of the buried layers present at different levels.

In the described known transistor structure these problems occur to a far smaller extent, but an important drawback is that in the known transistor according to the U.S. Pat. No. 3,766,446, the emitter zone is present for a large part within the highly doped base contact region. The emitter-base junction of the known transistor thus comprises a considerable part across which substantially there occurs no injection of minority charge carriers into the base, but which due to its extra surface, does increase the emitter-base capacitance considerably, to which the high doping of the base contact region contributes additionally. In particular at low currents this has a very adverse influence on the high-frequency characteristics, such as inter alia the cut-off frequency.

OBJECTS OF THE INVENTION

One of the objects of the invention is to avoid or at least considerably reduce the problems occurring in the known semiconductor device.

A further object of the invention is to provide a semiconductor device having a new transistor structure which is suitable for very high frequencies.

Still another object of the invention is to provide a lateral high-frequency transistor which, together with a vertical transistor having a structure which is complementary thereto and has corresponding electrical properties, can be used in a single epitaxial layer in a monolithic integrated circuit.

A further object of the invention is to provide a self-insulating lateral high-frequency transistor which is particularly suitable for use in monolithic integrated circuits.

SUMMARY OF THE INVENTION

The invention is based inter alia on the recognition of the fact that the high-frequency behaviour of the transistor can be considerably improved by suitable choice of the place of the emitter zone in the base region.

The invention is furthermore based on the recognition of the fact that it is of advantage to use such a lateral transistor structure that the charge transport in the active base region immediately adjoining the emitter zone takes place mainly in a direction substantially normal to the semiconductor surface. The invention is also based on the recognition of the fact that this can be achieved by ensuring that the difference in transit time through the base zone of minority charge carriers from several points of the emitter zone to the collector zone is as small as possible.

According to the invention, a semiconductor device of the kind described in the preamble is therefore characterized in that the emitter zone is present substantially entirely within the active base region.

The semiconductor device according to the invention comprises a lateral transistor which is capable of satisfactory operation at high frequencies in that the width of the active base region, taken from the emitter to the collector, can be made very small so that the difference in transit time of the charge carriers injected from the various points of the emitter to the collector contact region can be maintained small. Therefore, the width of the active base region, measured in the direction of the base contact region to the collector contact region, is preferably at most equal to the smallest distance between the active base region and the collector contact region, and is preferably at most equal to half said distance. The substantially homogeneously doped semiconductor layer may be of the first conductivity type. However, in a very important preferred embodiment the semiconductor layer is of the second conductivity type. In fact, the latter embodiment enables the provision in the semiconductor layer of both high frequency npn-transistors and pnp-transistors, the semiconductor layer constituting the collector zone of the vertical transistor. In order to enable a satisfactory operation and very high frequencies, it is furthermore desired that the smallest distance from the collector contact region to the active base region be so small that the depletion zone of the collector-base junction extends over the whole intermediate, substantially homogeneously doped semiconductor region. The very small thickness of the (substantially non-depleted) active base region then is decisive of the achievable frequency.

When the semiconductor layer is present on a substrate of a conductivity type opposite to that of the semiconductor layer, it is desirable, in order to prevent the substrate's collecting charge carriers emitted by the emitter of the latter transistor, that there be present a buried layer of the second conductivity type which is connected to the base contact region.

The invention also relates to a method by means of which the described device can be manufactured in a very simple manner. According to the invention in this method, a first and a second masking layer are successively provided one on the other, on the surface of a substantially homogeneously doped semiconductor layer, which masking layers can be etched selectively relative to each other, that a first aperture is provided in the second masking layer at the area of the base contact region to be provided and a second aperture is provided in the second masking layer at the area of the collector contact region to be provided. Within the first aperture, the exposed first masking layer is removed by etching, the first masking layer within the second aperture being masked against such etching process, after which, by introduction of a dopant determining the second conductivity type via the first aperture, at least a part of the base contact region is formed, which is then covered with an electrically insulating layer prior to the formation of the active base region, within the first aperture at least the edge portion of the masking layers nearest to the second aperture is subjected to an etchant which attacks only one of the two masking layers so that the masking layer is etched away selectively over a lateral distance which is smaller than half and preferably is smaller than one third of the shortest distance between the first and the second aperture. The etched masking layer is masked on its upper side against this etching process by a mask extending thereon up to the edge of the first aperture, after which, via the surface part present below said etched-away portion, the active base region is provided by the introduction of a dopant determining the second conductivity type, and the emitter zone and the collector contact zone are formed by the introduction of a dopant determining the first conductivity type via the said surface part and the second aperture.

BRIEF DESCRIPTION OF DRAWINGS

The invention will now be described in greater detail with reference to a few examples and the drawing, in which.

The Figures are diagrammatic and not drawn to scale. Corresponding parts are as a rule referred to by the same reference numerals.

For clarity, the boundary of doped regions, in particular of diffused regions, is in most of the cases not in accordance with reality but is shown purely diagrammatically. Notably the lateral diffusion is ignored in the drawings.

PREFERRED EMBODIMENT

The device comprises a semiconductor body 1, in this example a silicon plate, which contains inter alia a bipolar pnp-transistor $T_1$. The transistor $T_1$ has an emitter zone 3 of a first conductivity type, in this example a p-type zone, adjoining a surface 2 of the body, a base zone (4,5) of the second conductivity type, so in this example an n-type zone, which also adjoins the surface 2 and which surrounds the emitter zone 3 within the body entirely, and a collector zone 6 of the first (p) conductivity type adjoining the surface 2. The base zone comprises an active base region 4 and an associated base contact region 5 which is deeper and more highly doped than the active base region 4 and, like the emitter zone 3, is contacted at the surface 2.

The collector zone comprises a collector contact region 6 of the first (p) conductivity type which adjoins the surface 2 and is contacted at said surface 2 and has a higher doping concentration than the adjoining semiconductor material. Viewed in a direction parallel to the surface, the active base region 4 is present between the base contact region 5 and the collector contact region 6, while the emitter zone 3, the base regions 4 and 5 and the collector contact region 6 have a different doping form and are provided in a homogeneously doped (in this example n-type conductive) semiconductor layer 7 which adjoins the surface 2 and has a resistivity of approximately 1 to 2 Ohm.cm and which surrounds the collector contact region 6 and the base regions 4 and 5. Since the layer 7 in this example is an n-type layer, the collector layer is entirely formed by the collector contact region 6; this need not always be the case since, as will be explained hereinafter, the regions 3, 4, 5 and 6 may also be provided in a p-type layer.

According to the invention, the emitter zone 3 is situated substantially entirely within the active base region 4. As a result of this, an emitter-base junction is obtained which takes part in the injection substantially entirely and has a minimum capacitance, so that, in particular with low currents, the high-frequency properties are considerably improved and inter alia the cut-off frequency $(f_T)$ is increased.

The base contact region 5 is connected through the semiconductor layer 7 to an n-type conductive buried layer 8 and forms therewith a coherent n-type conductive region. The buried layer 8 is present between the layer 7 and an n-type conductive substrate 9 which adjoins same and has a resistivity of approximately 5 Ohm.cm and extends down to below the collector contact region 6, in which, however, the region 6 need not be present entirely above the layer 8. The buried layer 8 serves to prevent holes injected by the emitter zone 3 from being collected partly at the p-n junction 10 which in the operating condition is reversely biased. When the substrate 9 is of the same conductivity type as the layer 7, the buried layer 8 may be omitted, if desired. This is the case also when the transistor is provided in a single homogeneously doped body without an epitaxial layer. The regions 3, 5 and 6 are contacted via windows in an insulating layer 11, in this example of silicon oxide, provided on the semiconductor surface 2.

Figure 1:
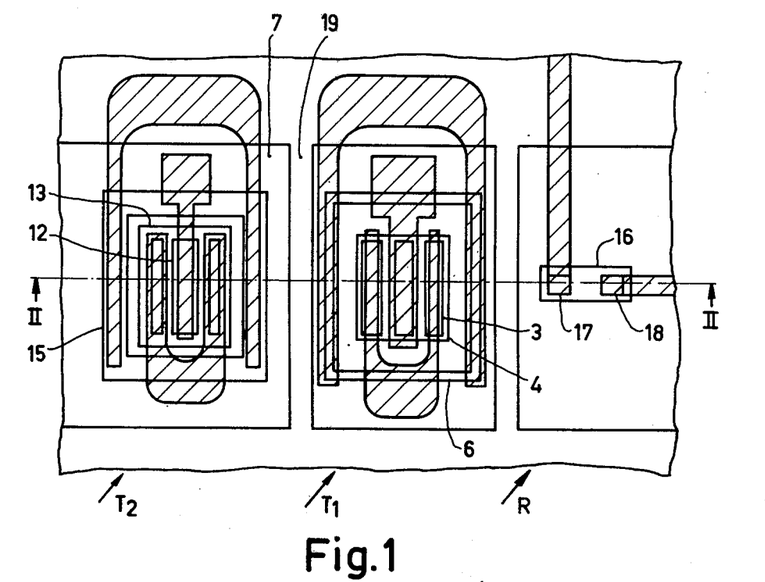
FIG. 1 is a diagrammatic plan view of a device according to an embodiment of the invention. The metallization being shaded and the solid lines depicting the boundaries of doped regions.

Since the dimension, taken in a direction from the emitter to the collector, of the active base region 4 in which the emitter is present can be maintained very small (in FIG. 1 the distance $a$ is 1 micron), the difference in transit time of the holes from any point of the emitter zone 3 to the collector contact region 6 may be minimum; this is the case in particular when, as in the present example, the width $a$ of the active base region 4, measured in the direction from the base contact region 5 to the collector contact region 6, is at most equal to half the smallest distance $b$ between the active base region 4 and the collector contact region 6. In FIG. 1 which, as already said, is not drawn to scale for reasons of clarity, the distance $a$ is 1 micron and the distance $b$ is 3 microns. This latter distance is so small that the depletion zone of the collector-base junction at normal values of the collector base voltage extends throughout the intermediate part of the layer 7. In these circumstances, the charge transport in this lateral transistor in the substantially nondepleted active base region 4 takes place by diffusing emitted holes mainly in a direction substantially normal to the semiconductor surface 2, which considerably improves the high-frequency properties of the transistor with respect to those of the conventional lateral pnp-transistors. The region between the active base region 4 and the collector contact region 6 is fully depleted, as already noted, and hence the effective base thickness is very small, since the depth of the emitter zone 3 is approximately 0.2 micron and that of the active base region 4 is approximately 0.3 microns.

In the example described the substantially homogeneously doped n-type semiconductor layer 7 forms part of the pnp-transistor $T_1$ and of a second bipolar npn-transistor $T_2$ which is complementary to the transistor $T_1$ and which has an n-type emitter zone 12 adjoining the surface 2 and a p-type base zone 13 which also adjoins the surface 2 and which surrounds the emitter zone 12 entirely within the semiconductor body, the collector zone of the transistor $T_2$ being formed by the layer 7 in which, to reduce the collector series resistance, an n-type buried layer 14 and n-type contact zones 15 are also provided. A resistor R is also provided consisting of a p-type surface zone 16 having $p^+$ contact zones 17 and 18. These three circuit elements are separated from each other by p-type insulation zones 19.

Since the charge transport in the non-depleted region between the emitter-base junction and the collector-base junction both in the transistor $T_1$ and in the transistor $T_2$ takes place mainly in a direction normal to the surface 2, the difference in the gain characteristics may be maintained small. So the invention offers the possibility of providing in a single epitaxial layer 7 two complementary transistors whose characteristics are comparable.

Figure 3:
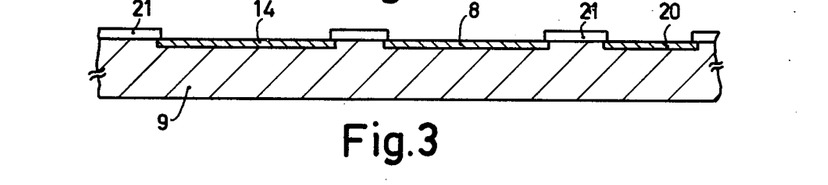
Figure 4:
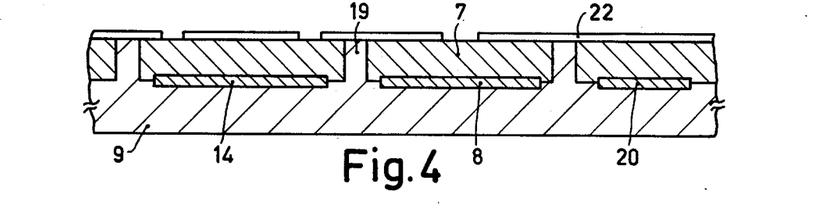

The described device may be manufactured, for example, as follows. Starting material (see FIG. 3) is a p-type silicon substrate 9 having a resistivity of approximately 5 Ohm.cm. Provided on said substrate by a generally known photolithographic method is an oxide mask 21 comprising apertures at the area of the buried n-type layers 14, 8 and 20 to be provided. These layers are provided, for example, by an arsenic diffusion, see FIG. 3 after which the oxide layer 21 is removed and a n-type silicon layer 7, for example 3 microns thick, is grown epitaxially by using conventional methods. The layer 7 has a resistivity of 1 to 2 ohm.cm; the buried layers prior to the epitaxial growth have a sheet resistance of 15 to 25 ohm per square. By a boron diffusion, separating channels 19 are diffused throughout the thickness of the layer 7 down to the substrate 9. A fresh oxide mask 22 is then provided in which apertures are etched at the area of the contact zones 15 to be provided of the npn-transistor and of the base contact zone 5 of the pnp-transistor, see FIG. 4.

Figure 5:
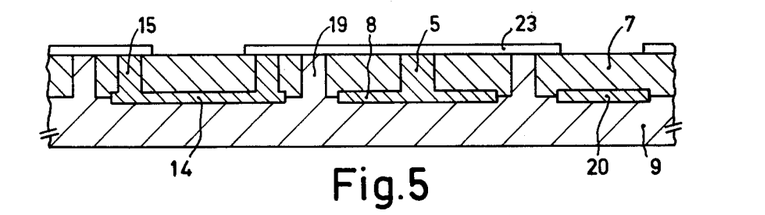
Figure 6:
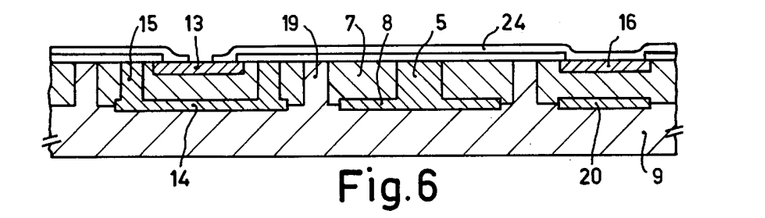

By a deep n-diffusion, for example a phosphorus diffusion, the n-type zones 15 and 5 are then provided after which the mask 22 is replaced by a fresh oxide mask 23 which, like the preceding masks, is formed by thermal oxidation or by pyrolytic deposition, in which mask 23, apertures are etched to form the p-type zones 13 and 16, see FIG. 5. Said zones 13 and 16 are then formed either by diffusion, or by ion implantation of, for example, boron, after which an oxide layer 24 is deposited pyrolytically over the assembly, in which layer an aperture is etched to provide the emitter zone 12 of the npn-transistor, see FIG. 6.

After the formation of the emitter zone 12, for example by an arsenic implantation, succeeded by an annealing treatment by heating at 1000° C in nitrogen, all the apertures necessary for the further dopings and all the contact windows are etched. The resulting mask is shown diagrammatically in a simplified form in FIG. 7 and bears reference numeral 11.

Figure 7:
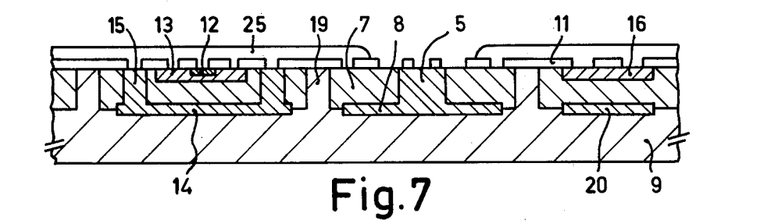
Figure 8:
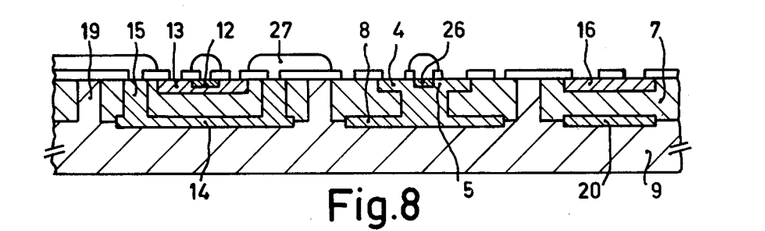

A photolacquer mask 25 is then provided which closes all the apertures with the exception of those for providing the active base region 4 and the emitter zone 3 and of the base contact window of the pnp-transistor $T_1$, see FIG. 7. By the implantation of, for example, arsenic ions, the active base region 4 of the transistor $T_1$ is then provided, an $n^+$ contact window 26 in the base contact region 5 being formed within the base contact window, see FIG. 8. The photolacquer mask 25 masks against said implantation and need not be provided very accurately since the oxide layer 11 also masks against said implantation. The photolacquer mask 25 is then replaced by a fresh photolacquer mask 27, see FIG. 8, which does not cover only the base contact windows of the npn-transistor $T_2$, the collector windows and the emitter windows of the pnp-transistor $T_1$ and the contact windows of the resistor R. As shown in FIG. 1, the emitter zone 3 of the pnp-transistor $T_1$ does not entirely surround the base contact window but the emitter zone 3 is divided into two separated zones so as to avoid short-circuit of the emitter-base junction upon contacting the emitter and the base.

Figure 2:
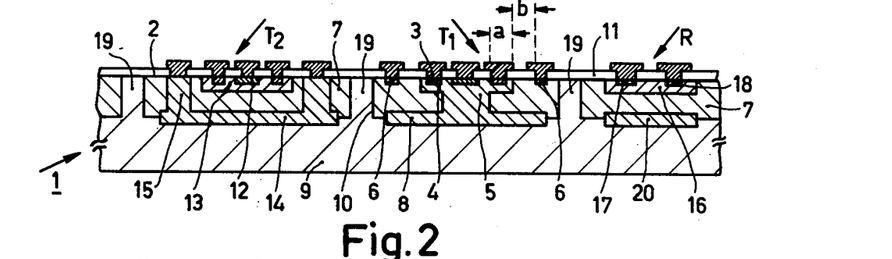
FIG. 2 is a diagrammatic cross-sectional view taken on the line II—II of the device shown in FIG. 1, FIGS. 3 to 9 show the device of FIGS. 1 and 2 in successive stages of manufacture.
Figure 9:
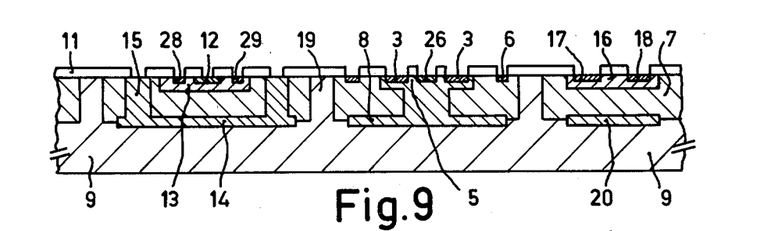

The contact diffusions 28 and 29 of the npn-transistor $T_2$, the collector contact zone 6, the emitter zones 3 of the pnp-transistor $T_1$ and the contact zones 17 and 18 of the resistor R are then formed by an implantation of boron ions, the mask 27 and the oxide layer 11 serving as a mask, see FIG. 9. After removing the photolacquer mask 27, the metallisation is then provided in the usual manner so that the structure shown in FIGS. 1 and 2 is obtained.

It will be obvious that, where ion implantations are used above, diffusions may also be used, in which case it should be taken into account that during the diffusion oxide masks or other pyrolytic masks are used instead of photolacquer masks, for the manufacture of which the normal photolithographic etching methods may be used.

In the above-described method of manufacture some masking windows are difficult to realise by using photolacquer masks due to the very small dimensions; this applies, for example, to the windows in the oxide layer 11 (FIG. 7) which serve for the formation of the active base region 4 and the emitter zone 3 of the transistor $T_1$. A method in which said drawback is reduced by using an underetching step will now be described with reference to FIGS. 10 to 19.

Figure 10:
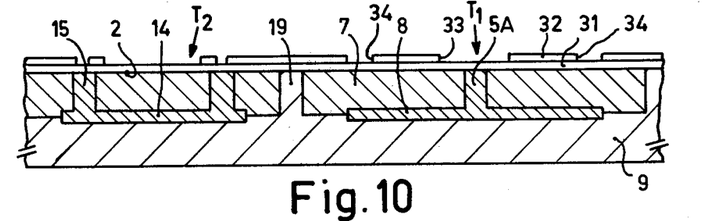
FIGS. 10 to 19 show successive stages of a semiconductor device manufactured by using the method according to the invention.
Figure 11:
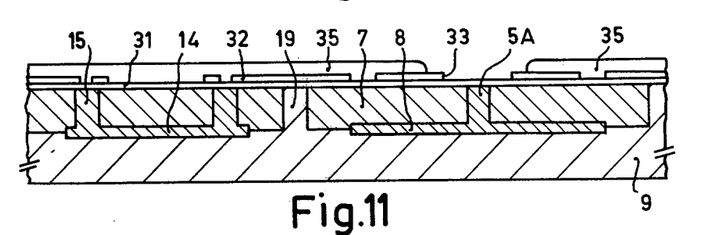
Figure 12:
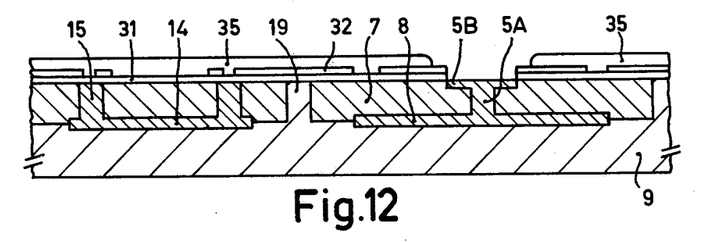

Starting material is the structure of FIG. 10 having a p-type substrate 9 and an n-type layer 7 which can be obtained in a manner analogous to that of the preceding example. Only the transistors $T_1$ and $T_2$ are shown in the figures; further circuit elements may be present in other places of the disk. The reference numerals correspond to those of FIGS. 1 to 9, in which the same parts of the device are referred to by the same reference numerals.

According to the invention, a silicon nitride layer 31 and a silicon oxide layer 32 are provided successively one on top of the other on the surface 2. As is known, these layers can be etched selectively relative to each other by means of specific etchants. Masking layers of other materials may also be used, provided they can be etched selectively relative to each other.

At the area of the base contact region 5A including the part 5B thereof still to be provided, a first aperture 33 is provided and, at the area of the collector contact region of the pnp-transistor $T_1$ to be provided, a second aperture 34 is provided in the second masking layer 32 of silicon oxide. Apertures are simultaneously provided at the area of the collector contact windows of the npn-transistor $T_2$ to be formed and of the base zone of said transistor, see FIG. 10. Subsequently, the exposed first masking layers 31 of silicon nitride within the first aperture 33 is removed by etching, the first masking layer 31 within the second aperture 34 being masked against said etching process, for example, by means of a photolacquer mask 35 which in this example covers all the apertures but for 33, see FIGS. 11 and 12, after which (see FIG. 12) via the aperture 33, the surfaceadjoining part 5B of the base contact region is further provided by introduction of a donor. This may be carried out, for example, by implantation of boron ions, the mask 35 and the oxide layer 32 serving as a mask, but, if desired, also by diffusion, in which case the mask 35 has first to be removed. When the layer 7 is thin, the base contact region 5 in this stage may also be provided entirely down to the buried layer 8, but when the layers are slightly thicker it is desired to form the region 5 in two steps as is described in this example.

Figure 13:
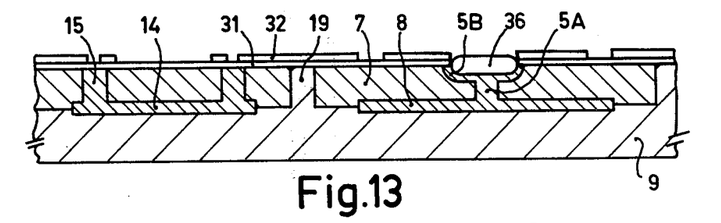

After removing the photolacquer mask 35 as insulating layer 36 which is approximately 1 micron thick and is partly sunk in the body is formed on the base contact region by thermal oxidation, the remaining part of the semiconductor surface being protected against said oxidation by the silicon nitride layer 31, see FIG. 13.

Figure 14:
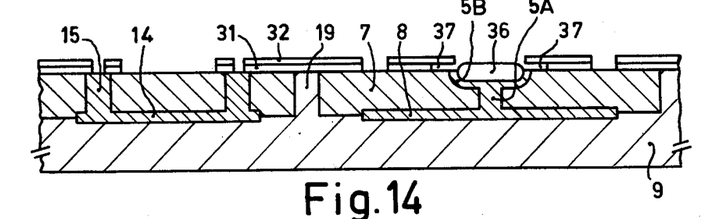

Prior to forming the active base region 4, at least the edge portion of the masking layers 31 and 32 nearest to the second aperture 34 is exposed to an etchant, in this case phosphoric acid, at approximately 150° C, which etchant attacks the silicon nitride 31 but leaves the oxide layer 32 substantially unattacked, see FIG. 14. The nitride layer 31 is etched away over a lateral distance which is smaller than half, and in this example is smaller than one third of, the shortest distance between the first and second apertures 33 and 34. During this etching process, the layer 31 is masked on the upper side by a mask extending thereon up to the edge of the first aperture 33 and formed by the layer 32. Due to underetching a part of the layer 31, approximately 1 micron wide, is removed which is denoted in FIG. 14 by 37. In this example, the nitride layer 31 within the second aperture 34 and within the contact windows and the base window of the npn-transistor $T_1$ are simultaneously etched away. Of course, the same underetching occurs which, however, is not shown in the figure for clarity and which is taken into account upon proportioning the masks. However, it is also possible first to mask said other apertures and to etch them free only afterwards in a second nitride etching step.

Figure 15:
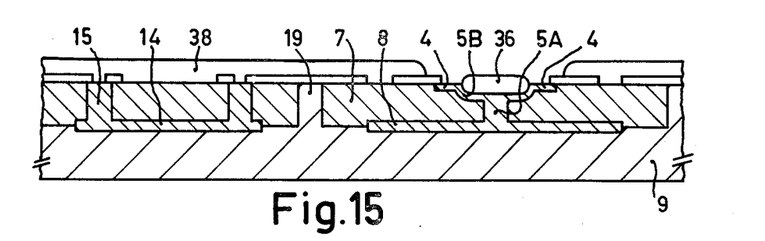

The active base region 4 is then provided by the introduction of an acceptor via the surface part present below the etched-away part 37, see FIG. 15. In the present example this is carried out by first removing the oxide layer 32 entirely, covering all the apertures except the etched-away part 37 with a photolacquer layer 38, and then implanting arsenic ions. The doping of the region 4, however, may also be carried out by diffusion, in which case, for example, a mask consisting of a pyrolytically deposited oxide layer should be used instead of a photolacquer mask, and the layer 32 may be maintained for the time being, if desired.

Figure 16:
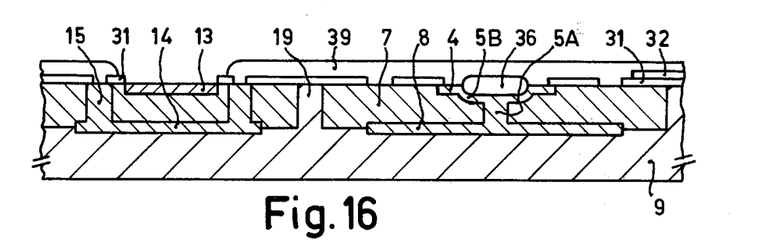
Figure 17:
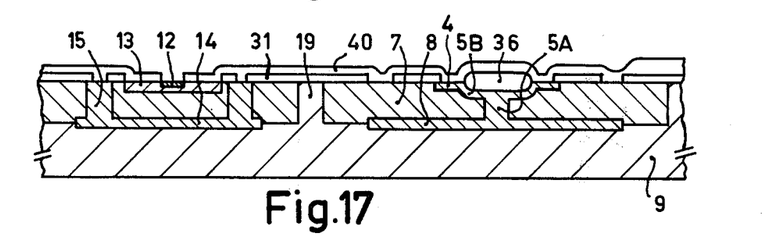
Figure 18:
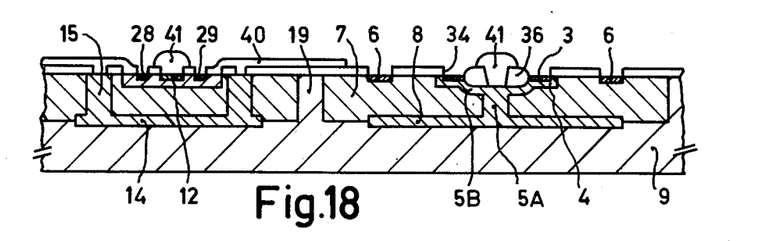

As shown in FIG. 16, the base zone 13 of the npn-transistor is then formed by an implantation of boron ions and the use of the nitride layer 31 as a mask, the remaining apertures being covered by a photolacquer mask 39 or in a different manner, after which a pyrolytically deposited layer 40 of silicon oxide is provided over the assembly, see FIG. 17. Via a window in said layer 40, the n-type emitter zone 12 of the npn-transistor $T_2$ is provided, for example, by implantation or diffusion of arsenic. The layer 40 is then provided with base contact windows for the npn-transistor $T_2$ and is removed from the whole region of the pnp-transistor $T_1$, while a base contact window for the transistor $T_1$ is etched in the oxide layer 36. This base contact window, the emitter window of transistor $T_2$ and the part of the active base region 4 not destined for providing the emitter zone are then closed with a photolacquer mask 41, see FIG. 18, after which the emitter zones 3 and the collector region 6 of the pnp-transistor $T_1$ are formed by the introduction of an acceptor via the surface part obtained by the above-described underetching and via the second aperture 34, in this example by the implantation of boron ions. This doping also may be carried out, if desired, by diffusion provided a refractory mask is used instead of the photolacquer mask 41. Simultaneously with said doping, the base contact zones 28 and 29 of the npn-transistor $T_2$ are formed, see FIG. 18. After removing the mask 41 and removing the oxide layer 40 of the collector contact window of the npn-transistor $T_2$, the metallisation is carried out and the device is ready for assembly, see FIG. 19.

In this example, the doping window for the regions 3 and 4 was obtained by underetching of the nitride layer 31. According to a modified embodiment of the method according to the invention, however, instead thereof the second masking layer, that is in the present example the oxide layer 32, may also be used for underetching. This is shown in FIGS. 20 to 24 in which for simplicity only the n-type semiconductor layer 7 and the transistor T₂ provided therein are shown. According to this modified embodiment, for example, after etching the first and second apertures 33 and 34 in the oxide layer 32, first the nitride layer 31 is etched away in the first aperture 33 at the area of the base and collector contact regions to be provided, after which a photolacquer mask 50 is provided which extends up to the edge of the first aperture 33, and in this example covers a part of said edge on the side remote from the aperture 34, see FIG. 20. A part 51 of the masking layer 32 below the edge of the mask 50 is then etched away, see FIG. 21, after which the mask 50 is removed and the base contact region 5 is provided, for example by ion implantation or diffusion, in the aperture 33 while using the silicon nitride layer 31 as a mask, in which or after which said base contact region 5 is covered with an insulating layer 52, for example a silicon oxide layer, see FIG. 22.

The aperture 34 is now covered, for example, with a photolacquer mask 53, and by means of a hot phosphoric acid solution the exposed silicon n-oxide is etched away after which (see FIG. 23) the active base region 4 is implanted. After removing the mask 53, the collector contact region 6 and the emitter zone 3 are then provided, see FIG. 24, and after metallisation the device may be assembled.

As in the preceding example, the zones 3 and 6 may in this case also be of the p-type and the regions 4 and 5 may be of the n-type so that a pnp-transistor is obtained. It will be obvious, however, that nn npn-transistor can be formed in an analogous manner. In general it holds that in all the examples the conductivity types of the various semiconductor regions and zones may all (simultaneously) be varied in the opposite conductivity type, although this may sometimes present technological problems in practice.

Figure 19:
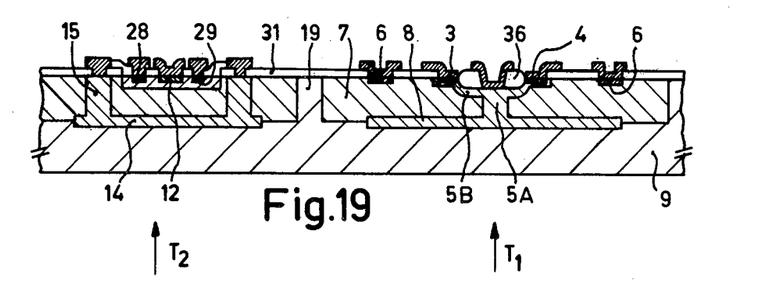
Figure 20:
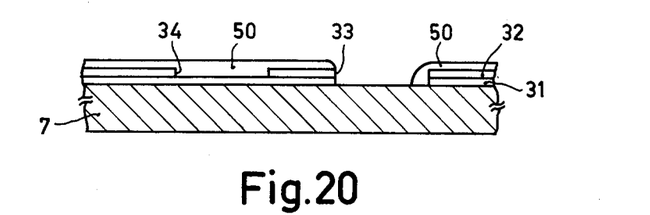
FIGS. 20 to 24 show successive stages of a modified embodiment of the method according to the invention.
Figure 21:
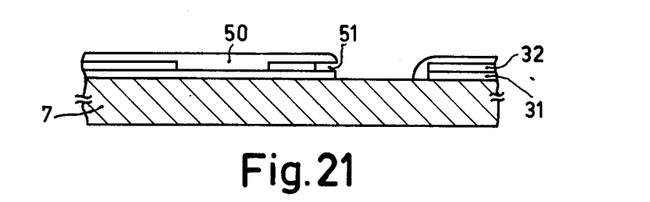
Figure 22:
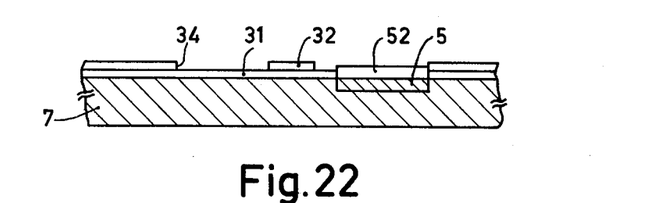
Figure 23:
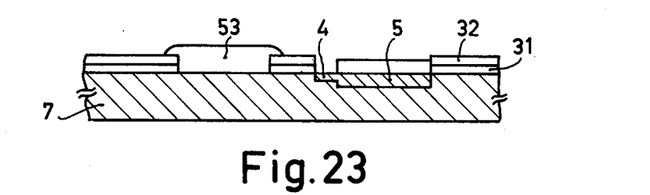
Figure 24:
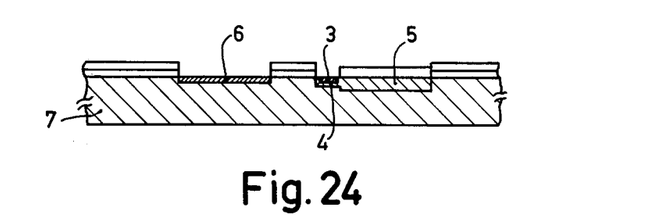

In this connection it is to be noted that in the examples described, with otherwise conductivity types remaining the same, the conductivity type of the layer 7 may moreover be reversed. For example, the collector-base junction in the pnp-transistor of FIGS. 2, 19 and 24 is formed between the p-type collector contact region 6 (which in this case forms the whole collector zone) and the layer 7. When in the said figures according to a further embodiment the layer 7 is p-type conductive instead of n-type conductive, the p-n junction between the collector zone and the base zone is formed between the n-type base regions 4 and 5 and the p-type layer 7.

Upon application of a transistor structure as that of transistor T₁ in a monolithic integrated circuit, the layer 7 will generally be of the n-type and the substrate 9 of the p-type. However, it is also possible that the layer 7 and the substrate 9 both are of the same conductivity type or that the layer 7 is formed by a homogeneously doped silicon plate. In that case the buried layer 8 is superfluous as a rule.

It will be obvious that the invention is not restricted to the embodiments described but that many variations are possible to those skilled in the art without departing from the scope of this invention. For example, if desired, semiconductor materials other than silicon, for example germanium or III-V compounds such as GaAs, and insulating layers other than silicon oxide and silicon nitride, for example aluminium oxide, may be used, provided the requirements of selective etchability are fulfilled. Also, instead of photolacquer masks, other masking layers may be used. The geometry of the resulting device may be varied within wide limits as will be obvious already by comparison of the transistors T₁ of FIGS. 2 and 19 with the transistor shown in FIG. 24 which are both embodiments of the device according to the invention.

What is claimed is:

1. A semiconductor device comprising a semiconductor body having a surface and comprising a substantially homogeneously doped semiconductor layer disposed at said surface, at least a bipolar transistor located in said body and comprising an emitter zone of a first conductivity type adjoining said surface, a base zone of second conductivity type which adjoins said surface and within said body surrounds said emitter zone entirely, and a collector zone that is of said first conductivity type and adjoins said surface, said base zone comprising an active base region and base contact region, said base contact region being associated with said active base region and being deeper and more highly doped than said active base region, said emitter zone being located substantially completely within said active base region, said base contact region and said emitter zone being contacted at said surface for electrical connection, said collector zone comprising a surface-adjoining collector contact region of said first conductivity type which is contacted at said surface and has a higher doping concentration than the adjoining semiconductor material, said active base region, when viewed in a direction parallel to said surface, being present between said base contact region and said collector contact region, said doped semiconductor surface layer surrounding said collector contact region and said base regions, whereby said emitter zone, active base region, base contact region and collector contact region are provided in and have a different doping concentration than said doped semiconductor surface layer.

2. A semiconductor device as in claim 1, wherein the width of said active base region, measured in the direction from the base contact region to the collector contact region, is at most equal to the smallest distance between said active base region and said collector contact region.

3. A semiconductor device as in claim 2, wherein said width is at most equal to half said distance.

4. A semiconductor device as in claim 1, wherein said doped semiconductor surface layer is of said second conductivity type.

5. A semiconductor device as in claim 1, wherein the smallest distance from said collector contact region to said active base region is sufficiently small so that the depletion zone of the junction between said collector and base regions extends over the whose part of said doped semiconductor surface layer intermediate thereto.

6. A semiconductor device as in claim 1, wherein said base contact region is connected through said doped semiconductor surface layer to a buried second conductivity type layer and forms therewith a coherent region of said second conductivity type, said body comprising a substrate having a conductivity type opposite that of said layer, said buried layer being present between said doped semiconductor surface layer and said substrate and extendind to below said collector contact region.

7. A semiconductor device as in claim 1, wherein said doped semiconductor surface layer comprises part of said transistor and part of a second bipolar transistor which is complementary to said first transistor, said second transistor comprising a surface-adjoining emitter zone of the same conductivity type as said semiconductor layer and a likewise surface-adjoining base zone of a conductivity type opposite to that of said doped semiconductor surface layer, said base zone surrounding said emitter zone entirely within said body, said second transistor comprising a collector zone formed by said doped semiconductor surface layer.

8. A semiconductor device as in claim 1, wherein said doped semiconductor surface layer is of n type conductivity.

9. A method of manufacturing a semiconductor device as recited in claim 1, comprising the steps of providing a semiconductor body comprising a substantially homogeneously doped semiconductor layer, providing first and second masking layers successively one on the other on the surface of said layer, which masking layers can be etched selectively relative to each other, providing a first aperture in said second masking layer at the area where the base contact region is to be provided and a second aperture in said second masking layer at the area where the collector contact region is to be provided, providing at said first masking layer located within said second aperture a mask to prevent etching thereof, removing by etching the exposed part of said first masking layer located within said first aperture, then introducing a second conductivity type dopant via said first aperture into said semiconductor layer to form at least a part of the base contact region and then covering the thus produced base contact region with an electrically insulating layer, subjecting at least the edge portion of the masking layers located within said first aperture and nearest to said second aperture to an etchant which attacks only one of the two said masking layers so that said one masking layer is etched away selectively over a lateral distance which is smaller than half of the shortest distance between said first and second apertures, the thus etched said masking layer being masked on its upper side against said etching process by a mask extending thereon up to the edge of said first aperture, and then providing the active base region at the surface part of said semiconductor layer present below said etched-away portion by introducing therein a second conductivity type dopant and forming said emitter zone and said collector contact region by the introducing therein a first conductivity type dopant via said second aperture.

10. A method as in claim 9, wherein said lateral distance is less than one-third said shortest distance between said first and second apertures.

11. A method as in claim 9, wherein the masking layer that is etched away selectively laterally is the first masking layer and the mask present thereon and extending up to the edge of the first aperture is formed by said second masking layer.

12. A method as in claim 9, wherein the masking layer which is etched away selectively laterally is the second masking layer.

13. A method as in claim 9, wherein said first masking layer consists of silicon-nitride and said second masking layer consists of silicon oxide.

* * * * *